(12) United States Patent
Cho

(10) Patent No.: US 10,431,381 B2
(45) Date of Patent: Oct. 1, 2019

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventor: Dong Su Cho, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/988,873

(22) Filed: May 24, 2018

(65) Prior Publication Data

US 2019/0066921 A1    Feb. 28, 2019

(30) Foreign Application Priority Data

Aug. 29, 2017    (KR) .................. 10-2017-0109572

(51) Int. Cl.
*H05K 1/18*    (2006.01)
*H01G 4/12*    (2006.01)
(Continued)

(52) U.S. Cl.
CPC .............. *H01G 4/224* (2013.01); *H01G 4/12* (2013.01); *H01G 4/232* (2013.01); *H01G 4/248* (2013.01);
(Continued)

(58) Field of Classification Search
CPC .... H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/167; H05K 1/18; H05K 1/181
See application file for complete search history.

(56) References Cited

U.S. PATENT DOCUMENTS

| 3,740,624 A | * | 6/1973 | McAdams, Jr. | ......... H01G 4/30 361/303 |
| 2009/0213525 A1 | | 8/2009 | Lee et al. | |
| 2010/0103586 A1 | * | 4/2010 | Tang | ..................... H01G 4/232 361/301.4 |

FOREIGN PATENT DOCUMENTS

| JP | 2009-200092 A | 9/2009 |
| KR | 10-0925624 B1 | 11/2009 |

* cited by examiner

*Primary Examiner* — Ishwarbhai B Patel
(74) *Attorney, Agent, or Firm* — Morgan, Lewis & Bockius LLP

(57) ABSTRACT

A multilayer capacitor includes: a capacitor body having a length and a width substantially equal to each other, including dielectric layers and a plurality of first and second internal electrodes, and having first to sixth surfaces; and first and second external electrodes disposed on third and fourth surfaces of the capacitor body and extending to cover a portion of fifth and sixth surfaces of the capacitor body, respectively; wherein the first internal electrode has a first lead portion exposed to a first corner of the capacitor body in which the third and fifth surfaces of the capacitor body meet each other and covered with the first external electrode, and the second internal electrode has a second lead portion exposed to a second corner of the capacitor body at which the fourth and sixth surfaces of the capacitor body meet each other and covered with the second external electrode.

20 Claims, 6 Drawing Sheets

(51) Int. Cl.
  *H01G 4/224*  (2006.01)
  *H01G 4/30*   (2006.01)
  *H01G 4/232*  (2006.01)
  *H01G 4/248*  (2006.01)
  H01G 4/012    (2006.01)
  H05K 1/11     (2006.01)
  H01G 4/008    (2006.01)
  H01G 4/08     (2006.01)
  H05K 1/02     (2006.01)

(52) U.S. Cl.
  CPC ............... *H01G 4/30* (2013.01); *H05K 1/181* (2013.01); *H01G 4/0085* (2013.01); *H01G 4/012* (2013.01); *H01G 4/08* (2013.01); *H01G 4/1227* (2013.01); *H05K 1/0231* (2013.01); *H05K 1/111* (2013.01); *H05K 2201/10015* (2013.01); *H05K 2201/10636* (2013.01)

MULTILAYER CAPACITOR AND BOARD HAVING THE SAME

CROSS-REFERENCE TO RELATED APPLICATION(S)

This application is based on and claims the benefit of priority to Korean Patent Application No. 10-2017-0109572 filed on Aug. 29, 2017 in the Korean Intellectual Property Office, the disclosure of which is incorporated herein by reference in its entirety.

TECHNICAL FIELD

The present disclosure relates to a multilayer capacitor and a board having the same.

BACKGROUND

A multilayer ceramic capacitor (MLCC) has features such as a small size, high capacitance, and ease of mountability.

A multilayer capacitor may be mounted on the circuit boards of various types of electronic products such as display devices including liquid crystal displays (LCDs), plasma display panels (PDPs), and the like, computers, smartphones, mobile phones, and the like, to thereby serve to charge or discharge electricity.

Further, such a multilayer capacitor may serve as a surface mount device (SMD)-type charge storage device mounted on a circuit board or used together with an inductor or a resistor to act as a filter.

The multilayer capacitor as described above may have a structure in which internal electrodes having different polarities are alternately stacked between a plurality of dielectric layers, and have directionality of external electrodes. Therefore, there is a problem in that it may be difficult to load a multilayer capacitor due to the directionality of the external electrodes. Particularly, when the multilayer capacitor is manufactured to have an abnormal size, this problem may be further intensified.

SUMMARY

An aspect of the present disclosure may provide a multilayer capacitor capable of solving a problem occurring at the time of loading the multilayer capacitor by removing directionality of external electrodes, and a board having the same.

According to an aspect of the present disclosure, a multilayer capacitor may include: a capacitor body having a length and a width substantially equal to each other, including dielectric layers and a plurality of first and second internal electrodes alternately disposed with respective dielectric layers interposed therebetween, and having first and second surfaces opposing each other, third and fourth surfaces connected to the first and second surfaces and opposing each other, and fifth and sixth surfaces connected to the first and second surfaces and the third and fourth surfaces and opposing each other; a first external electrode disposed on the third surface of the capacitor body and extending to cover a portion of the fifth surface of the capacitor body; and a second external electrode disposed on the fourth surface of the capacitor body extending to cover a portion of the sixth surface of the capacitor body, wherein each of the plurality of first internal electrodes has a first lead portion exposed to a first corner of the capacitor body in which the third and fifth surfaces of the capacitor body meet each other and covered with the first external electrode, and each of the plurality of second internal electrodes has a second lead portion exposed to a second corner of the capacitor body at which the fourth and sixth surfaces of the capacitor body meet each other and covered with the second external electrode.

A length of portions of the first and second lead portions exposed to the fifth and sixth surfaces of the capacitor body may be less than a half of the length of the capacitor body.

The first and second lead portions may have a tetragonal shape or triangular shape.

The first external electrode may extend to cover portions of the first, second and sixth surfaces of the capacitor body, and the second external electrode may extend to cover portions of the first, second and fifth surfaces of the capacitor body.

Each of the plurality of first internal electrodes may have a first body portion spaced apart from edges of the capacitor body and connected to the first lead portion. Each of the plurality of second internal electrodes may have a second body portion spaced apart from the edges of the capacitor body and connected to the second lead portion.

The capacitor body may further include covers at both outermost portions of the capacitor body in a stacking direction, in which the covers have the same material as the dielectric layers.

The covers may include one or more dielectric layers.

According to another aspect of the present disclosure, a multilayer capacitor may include: a capacitor body having a length and a width substantially equal to each other; at least one first internal electrode having a first lead portion exposed to a first corner of the capacitor body; at least one second internal electrode disposed alternately with the at least one first internal electrode in the capacitor body with each of dielectric layers interposed therebetween, and having a second lead portion exposed to a second corner of the capacitor body opposing the first corner in a diagonal direction; and first and second external electrodes disposed on both surfaces of the capacitor body opposing each other to be connected to the first and second lead portions, respectively.

A length of portions of the first and second lead portions exposed to the first and second corners of the capacitor body may be less than a half of the length of the capacitor body.

According to another aspect of the present disclosure, a board having a multilayer capacitor may include: a circuit board on which first and second electrode pads are formed; and the multilayer capacitor, described hereinbefore, mounted on the circuit board so that the first and second external electrodes are disposed on the first and second electrode pads, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Directions of a hexahedron will be defined in order to clearly describe exemplary embodiments in the present disclosure. X, Y and Z illustrated in the accompanying drawings refer to a length direction, a width direction, and a thickness direction, respectively.

Here, the thickness direction may be the same as a stacking direction in which dielectric layers are stacked.

Figure 1:
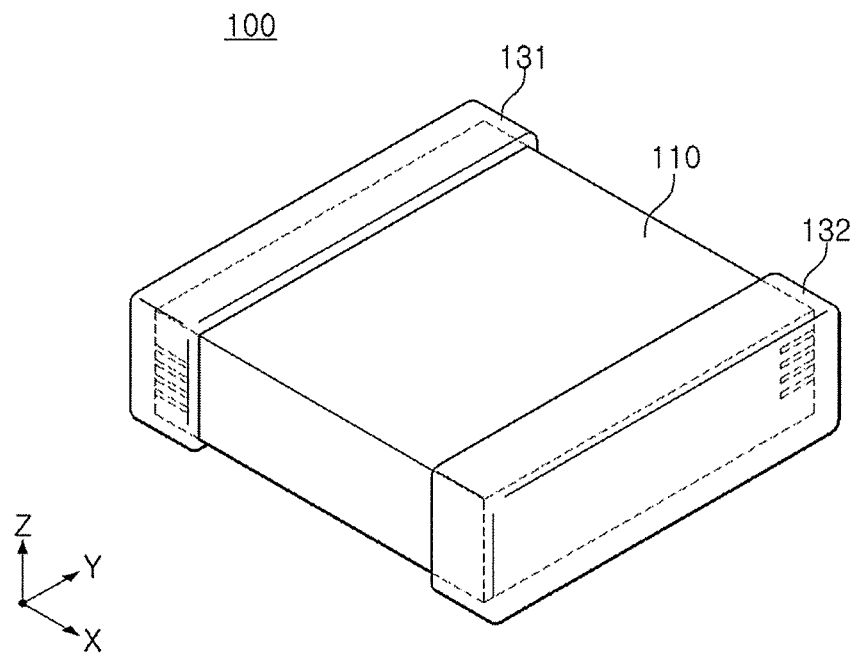
FIG. 1 is a perspective view schematically illustrating a multilayer capacitor according to an exemplary embodiment in the present disclosure.
Figure 2:
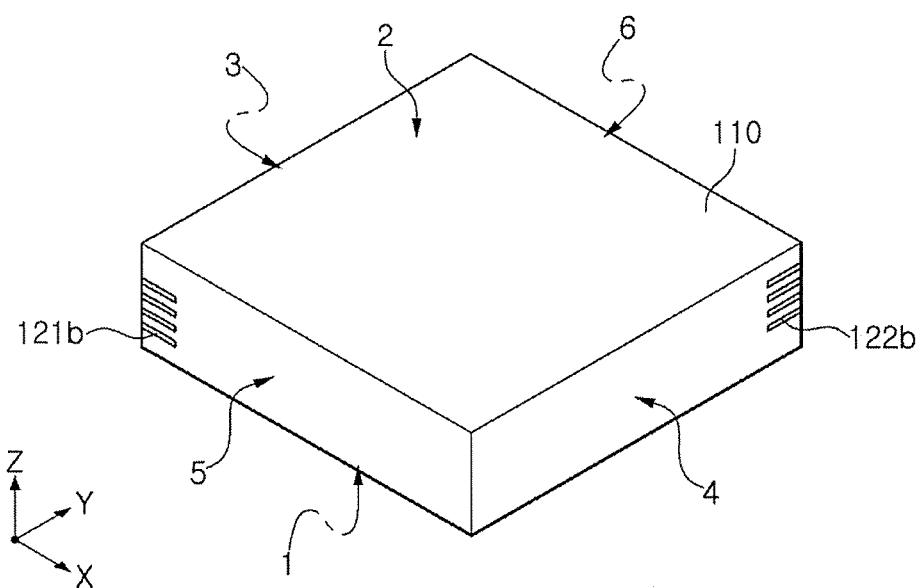
FIG. 2 is a perspective view illustrating the multilayer capacitor of FIG. 1 in a state in which external electrodes are separated.
Figure 3:
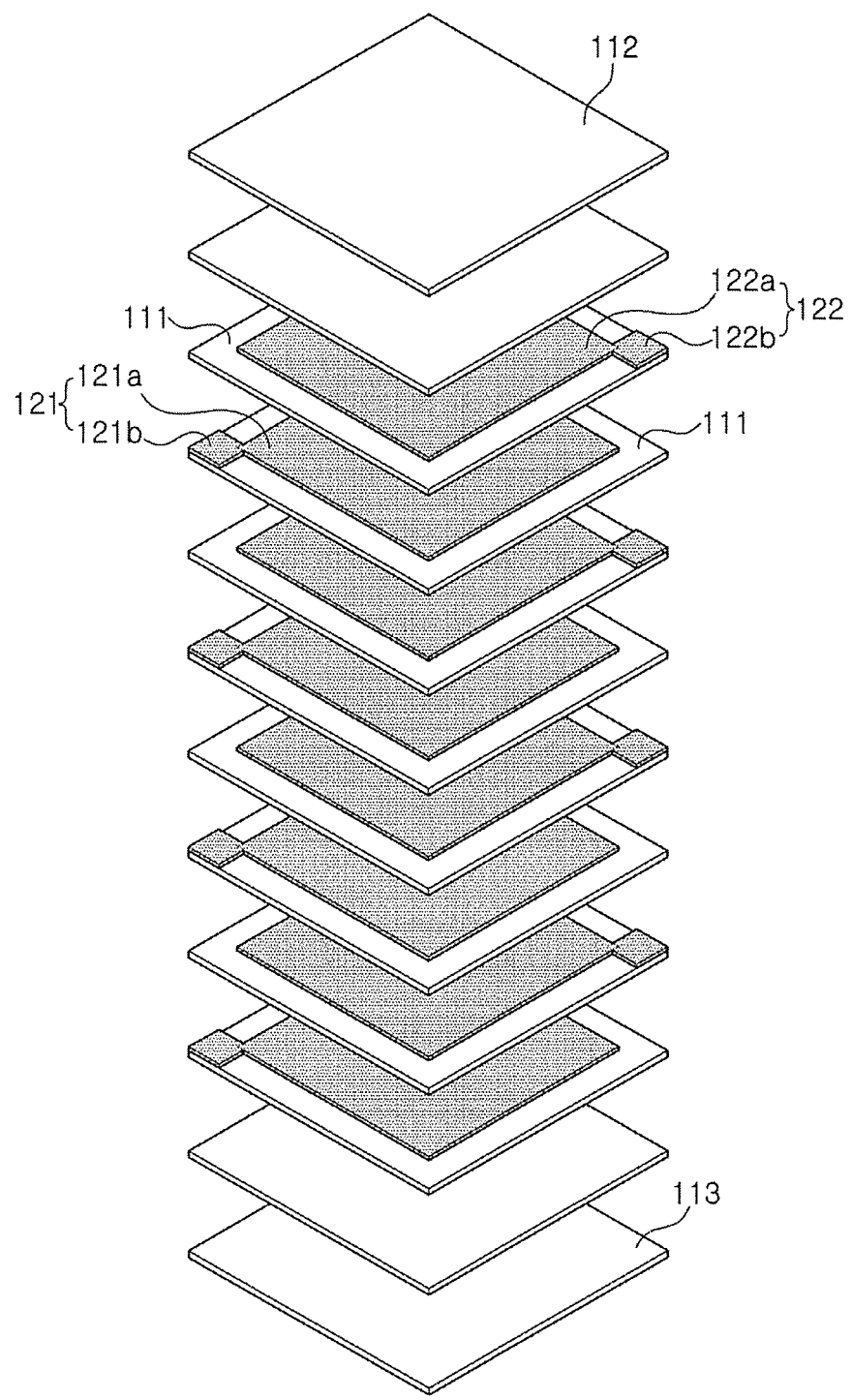
FIG. 3 is an exploded perspective view illustrating a stacked structure of first and second internal electrodes of FIG. 1.
Figure 4A:
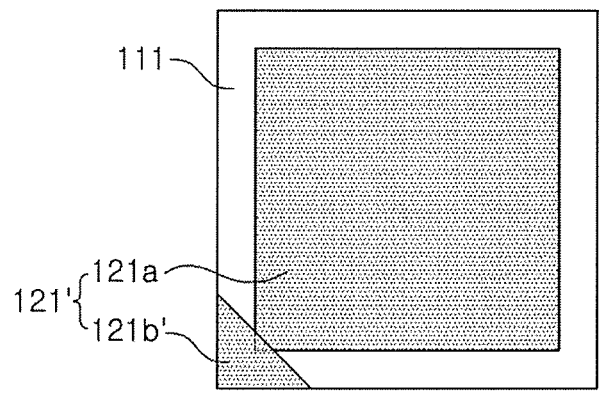
FIGS. 4A and 4B are plan views illustrating the first and second internal electrodes of FIG. 1, respectively.
Figure 4B:
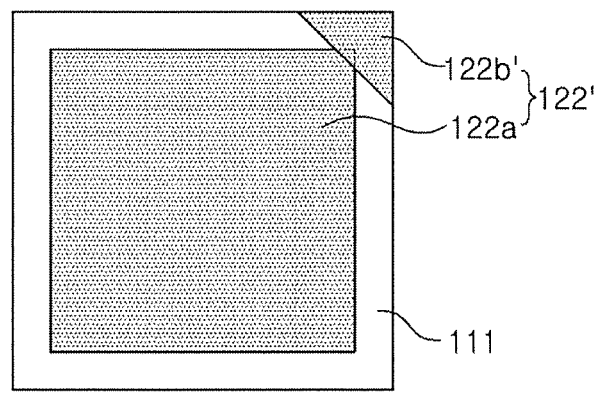
Figure 5:
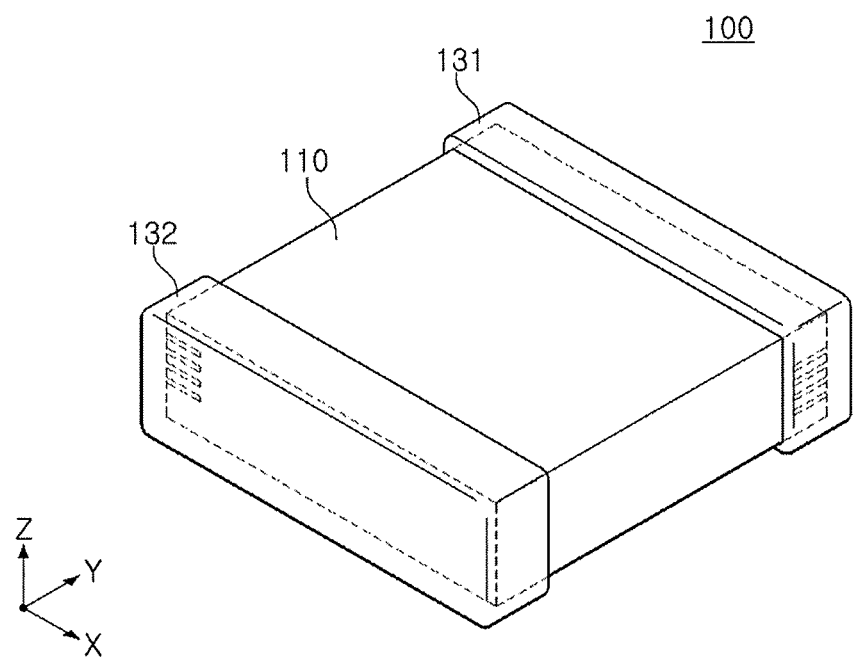
FIG. 5 is a perspective view illustrating a state in which the multilayer capacitor of FIG. 1 is rotated at an angle of 90 degrees in a transverse direction.

FIG. 1 is a perspective view schematically illustrating a multilayer capacitor according to an exemplary embodiment in the present disclosure, FIG. 2 is a perspective view illustrating the multilayer capacitor of FIG. 1 in a state in which external electrodes are separated, FIG. 3 is an exploded perspective view illustrating a stacked structure of first and second internal electrodes of FIG. 1, FIGS. 4A and 4B are plan views illustrating the first and second internal electrodes of FIG. 1, respectively, and FIG. 5 is a perspective view illustrating a state in which the multilayer capacitor of FIG. 1 is rotated at an angle of 90 degrees in a transverse direction.

Referring to FIGS. 1 through 5, a multilayer capacitor 100 according to the present exemplary embodiment may include a capacitor body 110 and first and second external electrodes 131 and 132.

The capacitor body 110 may include a plurality of dielectric layers 111 stacked in the Z direction and a plurality of first and second internal electrodes 121 and 122 alternately disposed in the Z direction with respective dielectric layers 111 interposed therebetween.

The capacitor body 110 may be formed by stacking the plurality of dielectric layers 111 and the first and second internal electrodes 121 and 122 in the thickness (Z) direction and sintering the stacked dielectric layers and internal electrodes, and have a substantially hexahedral shape as illustrated. Here, the capacitor body 110 may be formed so that a length thereof in the X direction and a width thereof in the Y direction are substantially equal to each other.

Therefore, the capacitor body 110 may have first and second surfaces 1 and 2 opposing each other in the thickness (Z) direction, third and fourth surfaces 3 and 4 connecting the first and second surfaces 1 and 2 to each other and opposing each other in the length (X) direction, and fifth and sixth surfaces 5 and 6 opposing each other in the width (Y) direction.

Hereinafter, in the present exemplary embodiment, a description will be provided on the assumption that a mounted surface of the multilayer capacitor 100 is the first surface 1 of the capacitor body 110.

The dielectric layers 111 may be in a sintered state, and adjacent dielectric layers 111 may be integrated with each other so that boundaries therebetween are not readily apparent without a scanning electron microscope (SEM).

Further, the dielectric layer 111 may contain ceramic powder having high permittivity, for example, barium titanate ($BaTiO_3$) based powder, strontium titanate ($SrTiO_3$) based powder, magnesium titanate, or the like, but the material of the dielectric layer 111 is not limited thereto as long as sufficient capacitance may be obtained.

In addition, if necessary, at least one of a ceramic additive, an organic solvent, a plasticizer, a binder, a dispersant, and the like, may be further added to the dielectric layer 111 together with the ceramic powder.

In addition, cover regions may be formed in upper and lower portions of the capacitor body 110 in the Z direction, respectively.

The cover regions may be formed by disposing covers 112 and 113 in both outermost portions of the capacitor body 110 in the Z direction as margins in the Z direction, respectively.

The covers 112 and 113 as described above may have the same material and configuration as those of the dielectric layer 111 except that internal electrodes are not included therein.

Further, the covers 112 and 113 may be formed by stacking one or two or more dielectric layers on both outermost portions of the capacitor body 110 in the Z direction, respectively, and may basically serve to prevent the first and second internal electrodes 121 and 122 from being damaged by physical or chemical stress.

The first external electrode 131 may be disposed on the third surface 3 of the capacitor body 110, and come in contact with an exposed portion of the first internal electrode 121 to thereby be electrically connected thereto.

Further, in the present exemplary embodiment, the first external electrode 131 may be formed to be extended from the third surface 3 of the capacitor body 110 to a portion of the fifth surface 5 thereof. Therefore, the first external electrode 131 may cover a first lead portion of the first internal electrode 121 to be described below.

In this case, if necessary, the first external electrode 131 maybe formed to be further extended to portions of the first and second surfaces 1 and 2 of the capacitor body 110 and a portion of the sixth surface 6 thereof to cover one end portion of the capacitor body 110.

Therefore, adhesion strength, electrical connectivity, moisture resistance reliability, and the like, of the first external electrode 131 may be further improved.

The second external electrode 132 may be disposed on the fourth surface 4 of the capacitor body 110, and come in contact with an exposed portion of the second internal electrode 122 to thereby be electrically connected thereto.

Further, in the present exemplary embodiment, the second external electrode 132 may be extended from the fourth surface 4 of the capacitor body 110 to a portion of the sixth surface 6 thereof. Therefore, the second external electrode 132 may cover a second lead portion of the second internal electrode 122 to be described below.

In this case, if necessary, the second external electrode 132 may be formed to be further extended to portions of the first and second surfaces 1 and 2 of the capacitor body 110 and a portion of the fifth surface 5 thereof to cover the other end portion of the capacitor body 110 opposing one end portion of the capacitor body 110 on which the first external electrode 131 is formed.

Therefore, adhesion strength, electrical connectivity, moisture resistance reliability, and the like, of the second external electrode 132 may be further improved.

Further, if necessary, the first and second external electrodes 131 and 132 may further include plating layers.

The plating layers may include nickel (Ni) plating layers and tin (Sn) plating layers formed on the nickel (Ni) plating layers.

The first and second internal electrodes 121 and 122, which are electrodes applied with different polarities, maybe alternately disposed in the capacitor body 110 in the Z direction with respective dielectric layers 111 interposed therebetween.

Here, the first and second internal electrodes 121 and 122 may be electrically insulated from each other by the dielectric layer 111 disposed therebetween.

A material forming the first and second internal electrodes 121 and 122 as described above is not particularly limited. For example, the first and second internal electrodes 121 and 122 may be formed using a conductive paste formed of at least one of a noble metal material such as palladium (Pd), a palladium-silver (Pd—Ag) alloy, or the like, nickel (Ni), and copper (Cu).

Here, as a printing method of the conductive paste, a screen printing method, a gravure printing method, or the like, may be used, but the printing method is not limited thereto.

Further, the first internal electrode 121 may include a first body portion 121a disposed to be spaced apart from edges of the capacitor body 110, and a first lead portion 121b exposed from the first body portion 121a to a first corner of the capacitor body 110 at which the third and fifth surfaces 3 and 5 of the capacitor body 110 meet each other.

The first lead portion 121b may be covered with the first external electrode 131 formed on the third and fifth surfaces 3 and 5 of the capacitor body 110 to thereby be electrically connected to the first external electrode 131.

Here, a length of a portion of the first lead portion 121b exposed to the fifth surface 5 of the capacitor body 110 may be less than a half of a length of the capacitor body 110 in the X direction, and a length of the first external electrode 131 formed on the fifth surface 5 of the capacitor body 110 may also be less than the half of the length of the capacitor body 110 in the X direction.

When the length of the portion of the first lead portion 121b exposed to the fifth surface 5 of the capacitor body 110 is more than the half of the length of the capacitor body 110, a short-circuit may occur.

In addition, the first lead portion 121b may have a tetragonal or triangular shape, as shown in FIG. 4A (e.g., a lead portion 121b' of an internal electrode 121').

Further, the second internal electrode 122 may include a second body portion 122a disposed to be spaced apart from the edges of the capacitor body 110 and overlap the first body portion 121a of the first internal electrode 121 disposed in the thickness (Z) direction to form capacitance, and a second lead portion 122b exposed from the second body portion 122a to a second corner of the capacitor body 110 at which the fourth and sixth surfaces 4 and 6 of the capacitor body 110 meet each other.

The second lead portion 122b may be covered with the second external electrode 132 formed on the fourth and sixth surfaces 4 and 6 of the capacitor body 110 to thereby be electrically connected to the first external electrode 131.

Here, a length of a portion of the second lead portion 122b exposed to the sixth surface 6 of the capacitor body 110 may be less than the half of the length of the capacitor body 110 in the X direction, and a length of the second external electrode 132 formed on the sixth surface 6 of the capacitor body 110 may also be less than the half of the length of the capacitor body 110 in the X direction.

When the length of the portion of the second lead portion 122b exposed to the sixth surface 6 of the capacitor body 110 is more than the half of the length of the capacitor body 110, a short-circuit may occur.

In addition, the second lead portion 122b may have a tetragonal or triangular shape, as shown in FIG. 4B (e.g., a lead portion 122b' of an internal electrode 122').

When the multilayer capacitor is formed so that the length thereof and the width thereof are equal to each other, and the lead portions are exposed to both corners of the capacitor body opposing each other in a diagonal direction as described above, at the time of mounting the multilayer capacitor on a circuit board, for example, the external electrodes may be disposed to be spaced apart from each other in the X direction or Y direction, such that the external electrodes may be freely disposed without limitation in directionality. Further, equivalent series resistance (ESR) of the capacitor body may be increased, and equivalent series inductance (ESL) thereof may be decreased.

Figure 6:
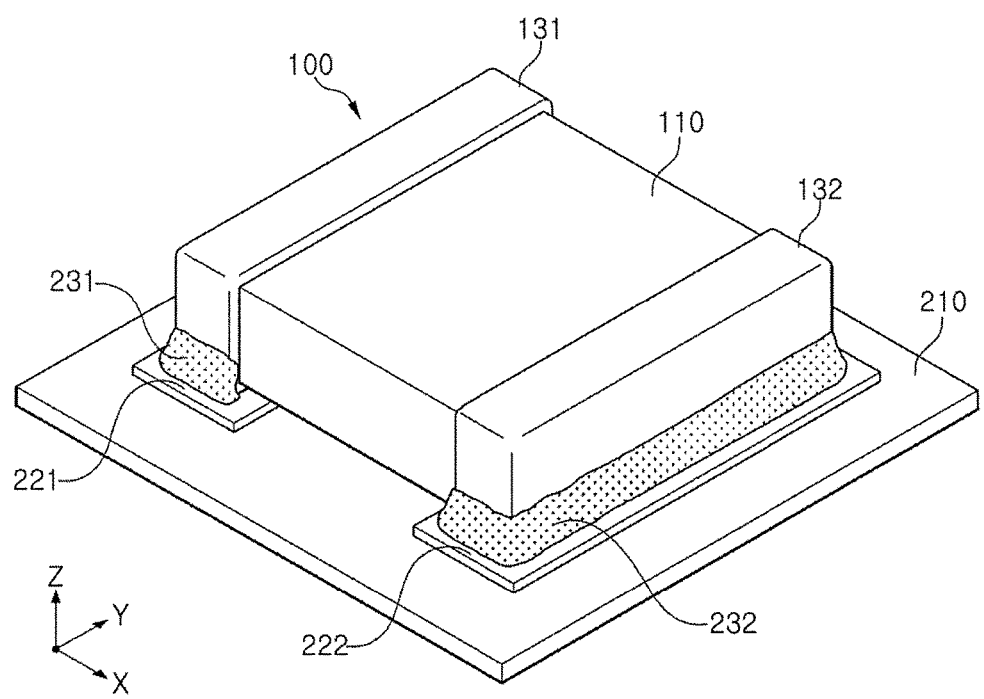
FIG. 6 is a perspective view illustrating a board in which the multilayer capacitor of FIG. 1 is mounted on a circuit board.
Figure 7:
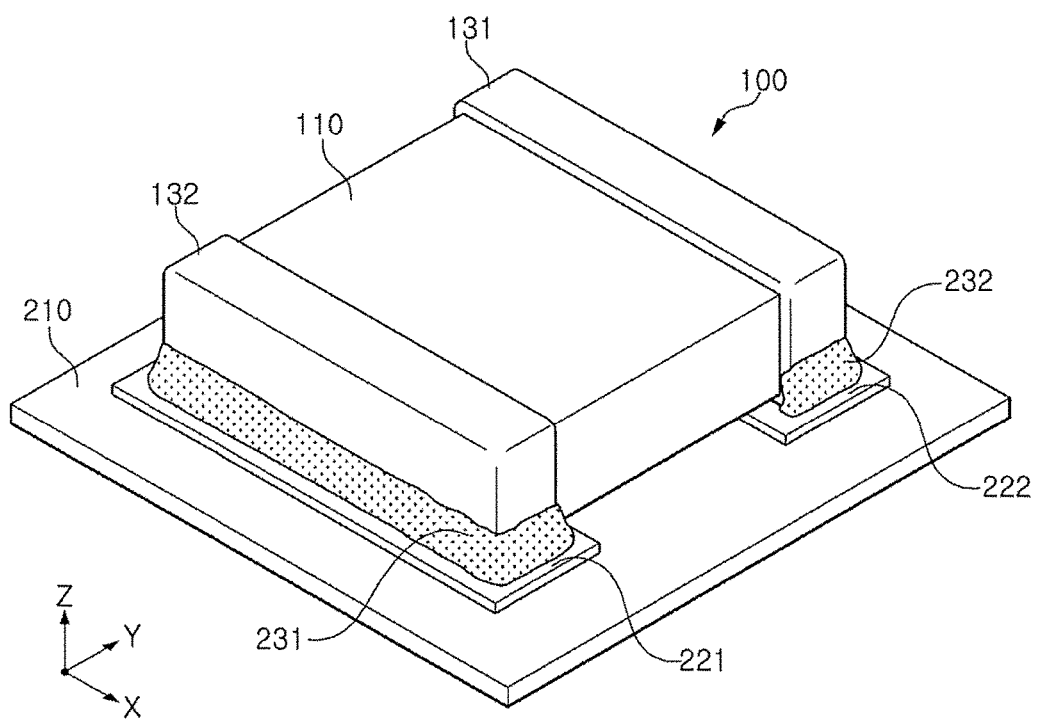
FIG. 7 is a perspective view illustrating a board in which the multilayer capacitor of FIG. 5 is mounted on a circuit board.

FIG. 6 is a perspective view illustrating a board in which the multilayer capacitor of FIG. 1 is mounted on a circuit board; and FIG. 7 is a perspective view illustrating a board in which the multilayer capacitor of FIG. 5 is mounted on a circuit board.

Referring to FIG. 6, a board 200 having a multilayer capacitor 100 according to the present exemplary embodiment may include a circuit board 210 on which the multilayer capacitor 100 is mounted, and first and second electrode pads 221 and 222 formed on an upper surface of the circuit board 210 to be spaced apart from each other.

The multilayer capacitor 100 may be electrically connected to the circuit board 210 by solders 231 and 232 in a state in which the first and second external electrodes 131 and 132 are positioned to come in contact with the first and second electrode pads 221 and 222, respectively.

Further, since the multilayer capacitor may be mounted in a state in which the multilayer capacitor is rotated in the transverse direction, after mass production of the multilayer capacitor, the multilayer capacitor may be easily and simply mounted on various circuit boards by only an operation of simply rotating the multilayer capacitor as in FIG. 7 regardless of shapes of electrode pads of the circuit board, such that a problem occurring at the time of loading the multilayer capacitor due to directionality of external electrodes may be solved.

As set forth above, according to exemplary embodiments in the present disclosure, since the capacitor body has the length and the width equal to each other, and the lead portions of the internal electrodes are exposed to both corners of the capacitor body opposing each other, respectively, directionality of the external electrodes may be removed, such that the problem occurring at the time of loading the multilayer capacitor may be solved.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a capacitor body having a length and a width substantially equal to each other, and including dielectric layers, a plurality of first internal electrodes, and a plurality of second internal electrodes alternately disposed with respective dielectric layers interposed therebetween, the capacitor body having first and second surfaces opposing each other, third and fourth surfaces connected to the first and second surfaces and opposing each other, and fifth and sixth surfaces connected to the first and second surfaces and the third and fourth surfaces and opposing each other;

a first external electrode disposed on the third surface of the capacitor body, a portion of the first external electrode extending to cover a portion of the fifth surface of the capacitor body; and a second external electrode disposed on the fourth surface of the capacitor body, a portion of the second external electrode extending to cover a portion of the sixth surface of the capacitor body, wherein each of the plurality of first internal electrodes has a first lead portion exposed to a first corner of the capacitor body in which the third and fifth surfaces of the capacitor body meet each other and covered with the first external electrode, such that adjacent edges of each of the plurality of first internal electrodes are spaced apart from the third and fifth surfaces of the capacitor body, respectively, by a substantially same distance, and each of the plurality of second internal electrodes has a second lead portion exposed to a second corner of the capacitor body at which the fourth and sixth surfaces of the capacitor body meet each other and covered with the second external electrode, such that adjacent edges of each of the plurality of second internal electrodes are spaced apart from the fourth and sixth surfaces of the capacitor body, respectively, by a substantially same distance.

2. The multilayer capacitor of claim 1, wherein a length of portions of the first and second lead portions exposed to the fifth and sixth surfaces of the capacitor body is less than a half of the length of the capacitor body.

3. The multilayer capacitor of claim 1, wherein the first and second lead portions have a tetragonal shape.

4. The multilayer capacitor of claim 1, wherein the first and second lead portions have a triangular shape.

5. The multilayer capacitor of claim 1, wherein the first external electrode extends to cover portions of the first, second and sixth surfaces of the capacitor body, and the second external electrode extends to cover portions of the first, second and fifth surfaces of the capacitor body.

6. The multilayer capacitor of claim 1, wherein each of the plurality of first internal electrodes has a first body portion spaced apart from edges of the capacitor body and connected to the first lead portion, and each of the plurality of second internal electrodes has a second body portion spaced apart from the edges of the capacitor body and connected to the second lead portion.

7. The multilayer capacitor of claim 1, wherein the capacitor body further includes covers at both outermost portions of the capacitor body in a stacking direction, the covers having the same material as the dielectric layers.

8. The multilayer capacitor of claim 7, wherein the covers include one or more dielectric layers.

9. A multilayer capacitor comprising:
a capacitor body having a length and a width substantially equal to each other;
at least one first internal electrode having a first lead portion exposed to a first corner of the capacitor body in which adjacent surfaces of the capacitor body meet each other, such that adjacent edges of the at least one first internal electrode are spaced apart from the adjacent surfaces of the capacitor body, respectively, by a substantially same distance;

at least one second internal electrode disposed alternately with the at least one first internal electrode in the capacitor body with each of dielectric layers interposed therebetween, and having a second lead portion exposed to a second corner of the capacitor body opposing the first corner in a diagonal direction, in which other adjacent surfaces of the capacitor body meet each other, such that adjacent edges of the at least one second internal electrode are, spaced apart from the other adjacent surfaces of the capacitor body, respectively, by a substantially same distance; and first and second external electrodes disposed on both surfaces of the capacitor body opposing each other to be connected to the first and second lead portions, respectively.

10. The multilayer capacitor of claim 9, wherein a length of portions of the first and second lead portions exposed to the first and second corners of the capacitor body is less than a half of the length of the capacitor body.

11. The multilayer capacitor of claim 9, wherein the first and second lead portions have a tetragonal shape.

12. The multilayer capacitor of claim 9, wherein the first and second lead portions have a triangular shape.

13. The multilayer capacitor of claim 9, wherein the at least one first internal electrode has a first body portion spaced apart from edges of the capacitor body and connected to the first lead portion, and the at least one second internal electrode has a second body portion spaced apart from the edges of the capacitor body and connected to the second lead portion.

14. The multilayer capacitor of claim 9, wherein the capacitor body further includes covers at both outermost portions of the capacitor body in a stacking direction, the covers having the same material as the dielectric layers.

15. The multilayer capacitor of claim 14, wherein the covers include one or more dielectric layers.

16. The multilayer capacitor of claim 9, wherein the dielectric layers contain at least one of barium titanate ($BaTiO_3$) based powder, strontium titanate ($SrTiO_3$) based powder or magnesium titanate.

17. The multilayer capacitor of claim 9, wherein the first and second external electrodes each include a tin (Sn) plating layer disposed on a nickel (Ni) plating layer.

18. The multilayer capacitor of claim 9, wherein the at least one first and second internal electrode each are composed of at least one of palladium (Pd), palladium-silver (Pd—Ag) alloy, nickel (Ni), or copper (Cu).

19. A board having a multilayer capacitor, the board comprising:
a circuit board on which first and second electrode pads are formed; and
the multilayer capacitor of claim 1, mounted on the circuit board so that the first and second external electrodes are disposed on the first and second electrode pads, respectively.

20. A board having a multilayer capacitor, the board comprising:
a circuit board on which first and second electrode pads are formed; and
the multilayer capacitor of claim 9, mounted on the circuit board so that the first and second external electrodes are disposed on the first and second electrode pads, respectively.

* * * * *